US008431063B2

(12) United States Patent
Beer et al.

(10) Patent No.: US 8,431,063 B2
(45) Date of Patent: Apr. 30, 2013

(54) HEAT TREATMENT FOR A PANEL AND APPARATUS FOR CARRYING OUT THE HEAT TREATMENT METHOD

(75) Inventors: Gottfried Beer, Nittendorf (DE); Markus Brunnbauer, Lappersdorf (DE); Edward Fuergut, Dasing (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1094 days.

(21) Appl. No.: 11/581,060

(22) Filed: Oct. 16, 2006

(65) Prior Publication Data

US 2007/0094982 A1 May 3, 2007

(30) Foreign Application Priority Data

Oct. 17, 2005 (DE) ........................ 10 2005 049 977

(51) Int. Cl.
*B29B 17/00* (2006.01)

(52) U.S. Cl.
USPC .................. 264/345; 264/272.17; 264/210.5; 264/327; 264/319; 264/903; 438/51; 438/106; 438/470; 438/550; 438/715

(58) Field of Classification Search .................. 264/345, 264/210.5, 319, 903; 438/15, 25, 51, 55, 438/64, 106, 107, 112, 121, 124, 125, 126, 438/127; 505/883; 257/684–688, 700, 707, 257/712, 718, 719, 725, 726, 727, 729, 730
See application file for complete search history.

(56) References Cited

U.S. PATENT DOCUMENTS 3,208,877 A * 9/1965 Merry .......................... 136/221
6,225,703 B1 5/2001 Umehara et al.
6,331,448 B1 12/2001 Ahmad
6,486,002 B1 11/2002 Low et al.
6,534,852 B1 3/2003 Lin et al.
6,724,080 B1 4/2004 Ooi et al.
2002/0093096 A1* 7/2002 Tago et al. .................... 257/738
2003/0041451 A1* 3/2003 Beroz et al. ..................... 29/840
2003/0104656 A1 6/2003 Ahmad
2003/0218263 A1* 11/2003 Blaszczak et al. ............ 257/788
2004/0035847 A1* 2/2004 Gat ........................... 219/444.1

FOREIGN PATENT DOCUMENTS

DE 199 32 269 A1 1/2000
DE 102 13 296 A1 10/2003
EP 0 110 285 A2 6/1984
EP 1 398 828 A2 3/2004
JP 06 084 988 A 3/1994
JP 2004 172 647 A 6/2004
JP 2005 36061 A 2/2005
WO WO 2004/070769 A2 8/2004

* cited by examiner

*Primary Examiner* — Jeffrey Wollschlager
*Assistant Examiner* — Stella Yi
(74) *Attorney, Agent, or Firm* — Eschweiler & Associates, LLC

(57) ABSTRACT

A heat treatment method is provided for a panel. The panel includes a plastic housing composition, in which semiconductor chips are embedded by their rear sides and edge sides, and the top sides of the semiconductor chips form a coplanar area with the plastic housing composition. The panel is fixed by its underside on a holder, and a temperature gradient (ΔT) is then generated between top side and the underside of the panel. The temperature gradient (ΔT) is then maintained for at least one delimited or selected time period. The panel is then cooled to room temperature ($T_R$).

12 Claims, 3 Drawing Sheets

14
15
17
13
1
2
9
16
10
8
21
18
6
7
3
4
5
11
24
12
$T_O$
$T_U$
$\Delta T$ $T_R$
1
18
2
6
4
5
7
11
3
9
8
$T_U=T_O=T_R$
$T_O$
$T_U$ $T_{260°}$
1
2
11
7
6
4
5
8
9
3
$T_U=T_O=T_{260°}$
$T_O$
$T_U$
$\alpha_O$
$\alpha_U$

HEAT TREATMENT FOR A PANEL AND APPARATUS FOR CARRYING OUT THE HEAT TREATMENT METHOD

CROSS REFERENCE TO RELATED APPLICATIONS

This application claims priority under 35 U.S.C. §119 to Application No. DE 102005049977.5 filed on Oct. 17, 2005, entitled "Heat Treatment Method for a Panel and Apparatus for Carrying out the Heat Treatment Method," the entire contents of which are hereby incorporated by reference.

FIELD OF THE INVENTION

The invention relates to a heat treatment method for a panel and an apparatus for carrying out the heat treatment method.

BACKGROUND

A panel for semiconductor components includes a composite plate with a plurality of semiconductor component positions, and the panel can be separated into a plurality of semiconductor components after completion of the panel. A panel of this type includes large-area plastic housing compositions. During the injection of plastic housing compositions of this type, or during the application of plastic housing compositions for protection of semiconductor chips and/or connecting elements arranged thereon (e.g., circuit substrates populated with semiconductor chips), the plastic housing composition is applied to the circuit substrate on one side with formation of a panel. When the plastic housing composition solidifies, it shrinks to a greater extent than the shaping substrate, which was not preheated, so that warping can occur due to the thermally dictated stresses that occur.

Such warping and deformations of a panel based on a circuit substrate for semiconductor components may be so great that the panel becomes unsuitable for further processing to form semiconductor components, particularly if it exceeds a delimited degree of deformation and has to be sorted out or rejected. In order to minimize the warping after the application of the plastic housing composition to the substrate, substrates are used which have an extreme stiffness and provide a planar intermediate product with applied plastic housing composition for the subsequent method steps.

German Patent Document No. DE 102 13 296 A1 discloses an electronic semiconductor component based on a panel with a circuit substrate, where the extreme stiffness of the wiring substrate is ensured by complying with the condition for the plastic of the circuit substrate that its glass transition temperature is significantly lower than the glass transition temperature of the plastic housing composition. This ensures that the substrate is already dimensionally stable when the plastic housing composition solidifies.

One disadvantage of this combination of extremely rigid circuit substrate and plastic housing composition (which is applied by injection-molding methods) is the high material outlay since the substrate has to have a minimum thickness in order to take up the thermal stresses with a minimum permissible warping. Moreover, there is constantly the risk of delamination between plastic housing composition and substrate for a panel constructed on a rigid substrate.

The problems become even greater for a panel produced in semiconductor wafer size from a plastic housing composition, where semiconductor chips are embedded by their rear sides and by their edge sides in the plastic housing composition, and the top sides thereof forming the coplanar area with the plastic housing composition without the plastic housing composition or the coplanar area being supported by a circuit substrate. During the injection molding of a panel of this type, the material in the region of the underside of the panel shrinks to a greater extent than the material on the top side of the panel, especially as a plurality of semiconductor chips are arranged in rows and columns. This may lead to an extreme warping after the injection molding since the shrinkage process during cooling is more greatly pronounced in the lower region of the panel than in the upper region of the panel.

Even if corresponding shaping of the injection mold nevertheless succeeds in compensating for this shrinkage effect and provides a panel which, after injection molding, has a warping that is within tolerance, the risk of warping still exists for a panel of this type (i.e., including plastic housing composition and semiconductor chips without any support by a substrate) as soon as the panel is heated to relatively high temperatures. This is because the coefficient of thermal expansion in the lower region of the panel (which consists exclusively of plastic housing composition) is significantly greater than the coefficient of thermal expansion that results from the combination of semiconductor chips and plastic housing composition in that region of such a panel which is near to the top side. This means that the panel that initially appears planar is warped during the further processing processes in which, by way of example, soldering temperatures of up to 260° C. occur, as soon as solder balls are soldered as external contacts onto the coplanar area after the application of a wiring structure.

A degree of warping can occur due to the different coefficients of thermal expansion between underside and top side of the panel so that a panel taken from the soldering furnace is so deformed and warped that it can no longer be separated into individual semiconductor components by the normal means. It is also the case for application of a rewiring structure to a coplanar surface of such a panel that narrow tolerances for a still permissible minimum warping are predefined for the photolithographic processes. Since the photoresist processes with heating methods for the crosslinking of the photoresist also work at up to 160° C., high levels of panel warping cannot be afforded tolerance.

The various known design measures for reducing warping are also unable to solve the problem, particularly of a panel which includes essentially plastic housing composition and semiconductor chips, such as, for example, the "balanced design" described in U.S. Pat. No. 6,331,448 which relates to flat conductor leadframes encapsulated by injection molding. The "balanced design" for metal layers on circuit boards, which is also described in U.S. Pat. No. 6,534,852, cannot be used for solving these problems. Further design measures, such as the types described in U.S. Pat. No. 6,724,080 (in which a heat distribution part is introduced into a position of the plastic housing in order to avoid warping by applying a counterforce against a warping) are unsuitable for the panel at issue here.

Designs with film substrates, such as the types described in U.S. Pat. No. 6,486,002, also cannot be used for solving the problem outlined above. The same applies for the plate-type part with a small coefficient of linear expansion on the semiconductor chip, such as the types described in U.S. Pat. No. 6,225,703.

In addition to design measures, after treatment measures have also been developed for reducing the warping by cooling a panel in the clamped-in planar state or by clamping in a curved system between two planar or plane plates in order to avoid warping of the product after injection molding and in order to prevent defects by clamping part in flat between a lower heating block and an upper heating block, as described in Japanese Patent Document No. JP 608 49 88.

SUMMARY

The present invention provides an after treatment method for a panel comprising a plastic housing composition, in which semiconductor chips are embedded by their rear sides and edge sides and the top sides thereof form a coplanar area with the plastic housing composition, where the heat treatment method overcomes the disadvantages as noted above and the panels treated by this heat treatment method according to the invention provide reduced warping that is still permissible in the context of photoresist steps. The invention further provides an apparatus to produce such minimally warped panels.

The invention provides a heat treatment method for a panel comprising a plastic housing composition, in which semiconductor chips are embedded by their rear sides and edge sides and the top sides thereof form a coplanar area with the plastic housing composition. The underside of the panel is formed by the plastic housing composition itself. The heat treatment method includes the following method steps. The panel is fixed by the underside on a holder. A temperature gradient is subsequently generated between the top side comprising the coplanar area and the underside of the panel. The temperature gradient is maintained for a delimited or selected time period. The panel is then cooled to room temperature and can be removed from the holder as a dimensional stable planar panel.

This method provides a number of advantages including, without limitation, the advantage that generating a temperature gradient between the top side comprising coplanar area and the underside of the panel allows the plastic housing composition, in which the edge sides and rear sides of the semiconductor chips are embedded by an injection method, time to initiate material relaxation processes which require a planar orientation of a top side and underside of the panel. In one preferred embodiment for carrying out the method, the fixing of the panel is carried out mechanically using a holding frame on a planar holder. The holding frame may be embedded in the form of a circular rack construction adapted to the semiconductor wafer contour of the panel.

The fixing of the panel is preferably achieved pneumatically by using a planar vacuum holder. Such a vacuum holder, also called a "vacuum chuck", fixes the underside of the panel on the vacuum holder by reduced pressure on the underside and normal atmospheric pressure on the top side of the panel. A further possibility for fixing the panel consists in carrying out a pressing onto a planar holder by using press-on plates. In contrast to conventional techniques, however, the press-on plates and the holder are not both heated. Rather, a temperature gradient is established between the holder and the press-on plates, and this temperature gradient brings about an increase in the temperature toward the top side and/or toward the underside depending on the history of the panel.

The generation of a temperature gradient $\Delta T$ between top side and underside of the panel may preferably be achieved by thermal irradiation onto the top side of the panel. During a thermal irradiation, the quantity of heat to be introduced into the top side of the panel can be precisely controlled by control and measurement of the brightness of the thermal radiation source.

The generation of the temperature gradient between the top side and the underside of the panel may also be achieved by heating the holder and cooling the top side of the panel, if the history of the panel requires such a temperature gradient orientation in order to initiate corresponding relaxation processes in the plastic housing material. For example, the holder may be heated electrically, while the cooling of the top side is achieved using a gas or liquid flow.

Alternatively, the temperature gradient is achieved by cooling the underside of the holder and heating the top side by gas and/or liquid flow. In this embodiment, a hot gas flow or a heated liquid is passed over the top side, while cooling of the holder is simultaneously achieved, for example, using Peltier elements or using corresponding cooling channels in the holder.

The magnitude of the quantity of heat fed to the panel is dimensioned such that an optimum relaxation process can be initiated in the material of the panel. Relaxation processes relate exclusively to the plastic housing composition, especially as semiconductor materials are not subjected to such relaxation processes. It may furthermore be entirely advantageous for the magnitude of the quantity of heat fed to the panel to be dimensioned such that thermal stresses are frozen during the cooling process in the panel.

It may be advantageous to take account of the stresses which still occur during further processing of the panel, such as during the application of a rewiring composition and also during the soldering of external contacts onto the top side of the panel. Preferably, the temperature gradient $\Delta T$ is varied dynamically during the heat treatment method, with the result that time periods with temperature gradients of different magnitudes are strung together.

It is also possible, in one preferred implementation of the method, to generate temporally steeply rising temperature gradients between the underside and the top side of the panel in order to counteract a thermal history in the production of a panel, and to provide a relatively dimensionally stable panel having a planar top side and a planar underside for further processing.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
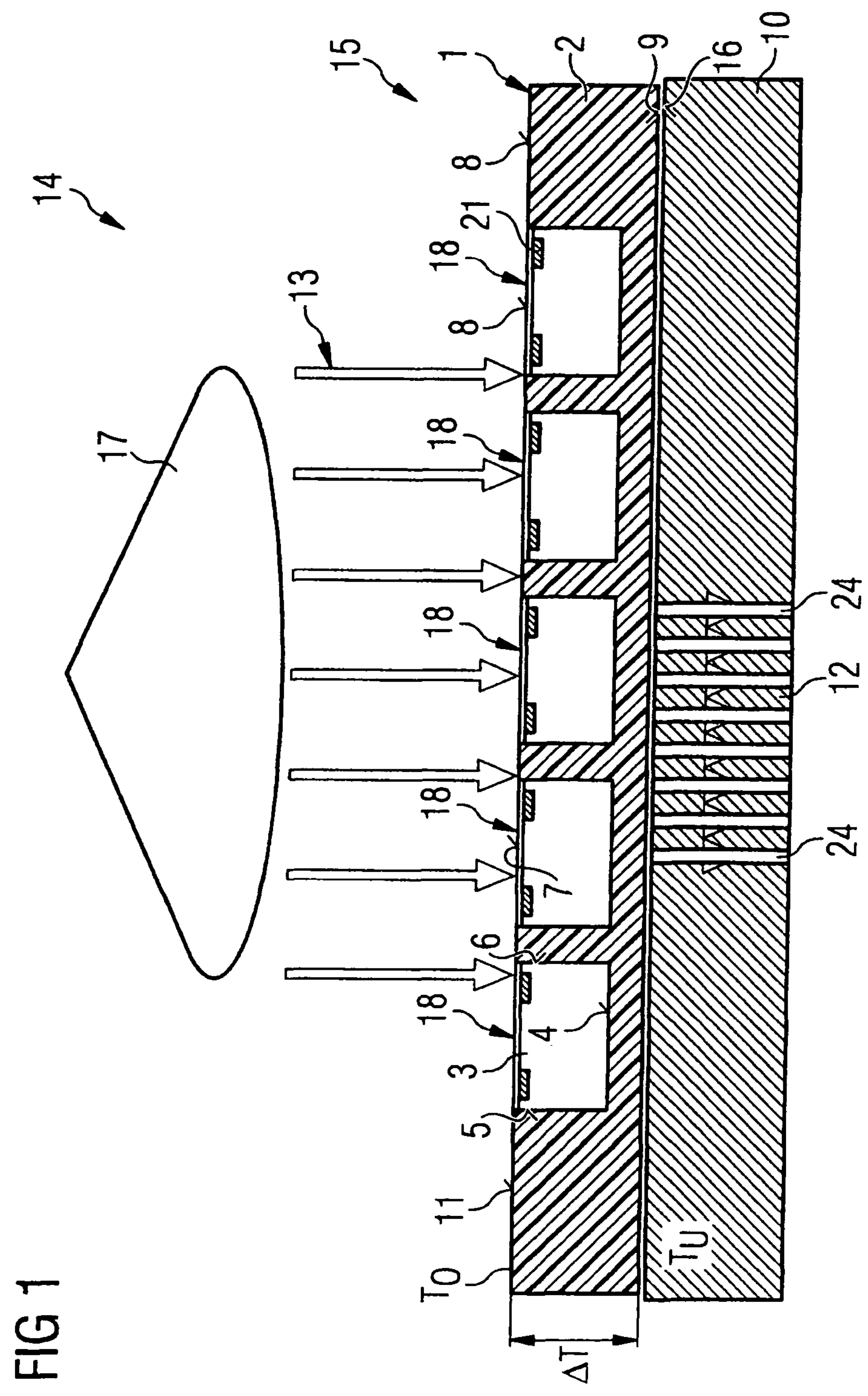
FIG. 1 shows a schematic in cross-section of an apparatus for carrying out the heat treatment method for a panel in accordance with the present invention.

FIG. 1 shows a basic schematic diagram of an apparatus 14 to carry out the heat treatment method according to the invention for a panel 1. The apparatus 14 includes a vacuum holder 12, which is held at a lower temperature $T_U$ during the heat treatment method. In the vacuum holder 12, a vacuum is generated which fixes the underside 9 of the panel 1 on the top side 16 of the holder 10. The panel 1, which is thus pressed onto the top side 16 of the holder 10 by the ambient atmospheric pressure, includes a plastic housing composition 2, in which semiconductor chips 3 are embedded by their edge sides 5 and 6 and also their rear side 4, while the top sides 7 of the semiconductor chips 3 form a coplanar area 8 with the plastic housing composition 2, so that the active top sides 7 of the semiconductor chips 3 are freely accessible.

In order to obtain a temperature-resistant dimensional stabilization of the panel 1, a temperature gradient $\Delta T$ is set between the underside 9 of the panel and the top side 11 of the panel, the top side 11 of the panel including a top side temperature $T_O$ generated by a heat radiator 17, which provides thermal irradiation 13 of the top side 11 of the panel 1. The irradiation intensity of the thermal radiation 13 can be set by a control unit in such a way as to establish a temperature difference or a temperature gradient $\Delta T$ between the underside 9 and the top side 11 of, for example, 300° C. for a time period $\Delta t$ of 5 minutes.

The temperature gradient $\Delta T$ in the panel position 15 of the apparatus 14 that is shown initiates relaxation processes in the plastic housing composition 2 of the panel 1 which effect a dimensional stabilization of the panel 1 such that, during subsequent production steps, the panel withstands the thermal loading associated with a production step (e.g., during a soldering process) with minimal warping that is within permissible minimum range or degree of warping. After a heat treatment time of just 5 minutes at $\Delta T$ of approximately 300° C., it is possible for the panel 1 to be removed from the apparatus as soon as the cooling phase is concluded. In order to accelerate such a cooling phase, the vacuum holder 12, also called a "vacuum chuck", may be cooled via cooling channels while the heat radiator 17 is turned off.

The apparatus of FIG. 1 provides at least the advantage that it is possible to use the heat radiator 17 in the form of a regulatable white light lamp for preheating the panel 1 of the size and form of a semiconductor wafer, such white light lamps already having proved successful as a heat source in some processes of semiconductor technology. The heat is coupled via the active top side 7 of the semiconductor chips 3. A gradient is achieved or set in the component through targeted control of the feeding or dissipation of energy at the top side and/or underside of the panel. With corresponding embodiments of this apparatus, the gradient can become both statically and highly dynamically effective by driving the intensity of the heat radiator 17 up and down in rapid succession. Highly dynamic or abrupt cooling after heating by a heat radiator of this type is also possible, particularly when the holder 10 is actively cooled by a cooling medium.

Another possibility for highly dynamic cooling is cooling the heated panel with a liquid shower. The temperature gradient can also be regulated using a liquid flow and/or a thermal power output and thermal capacity of the heat radiator. A further possibility for performing a highly dynamic change in the temperature gradient after heating by the heat radiator 17 can also be provided by blowing in a gas or by streaming in a liquid via vacuum openings 24 in the vacuum holder 12. In an alternative apparatus, the panel is positioned between two thermoholders 10 which are cooled and heated highly dynamically opposite to one another, so that correspondingly desired temperature gradients can be established in the component.

Figure 2:
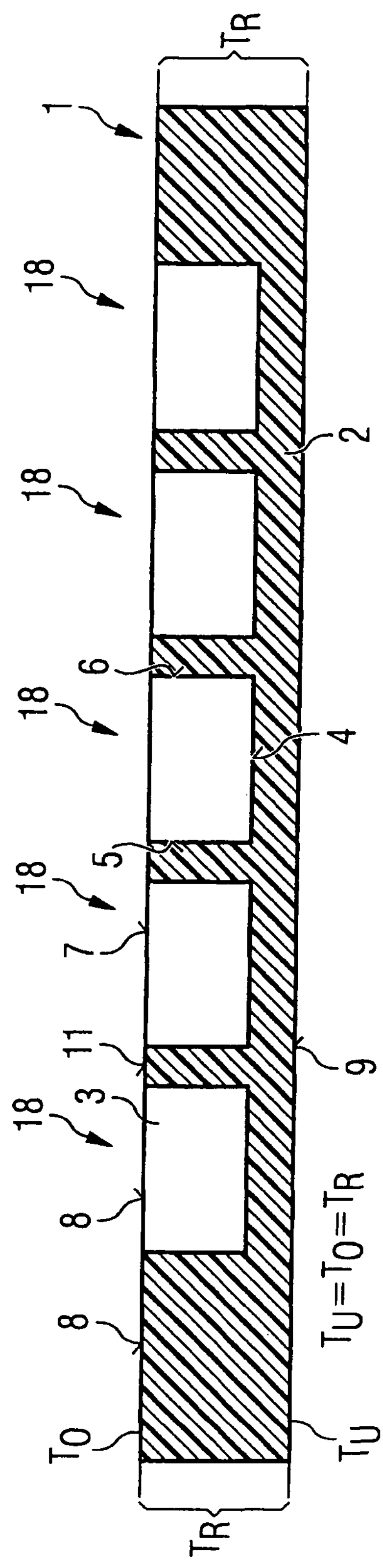
FIG. 2 shows a schematic cross-section through a panel that has not been subjected to heat treatment, at room temperature $T_R$ after the mold release of the panel from an injection mold.

FIG. 2 shows a schematic cross-section through a panel 1 at ambient or room temperature $T_R$ (e.g., conventional or standard ambient temperature including, without limitation, temperatures in the range of from about 20° C. to about 30° C.) after the mold release of the panel 1 from an injection mold. The panel 1 was held in the injection mold until it is present in the dimensionally stable and planar orientation below the glass transition temperature in FIG. 2. Due to the shrinkage effect as described above, which is greater upon mold release in the lower region of the panel 1 than in the region of the panel 1 that is near to the surface, the glass transition temperature of the plastic housing composition 2 is preferably awaited before the panel 1 is removed from the mold, in order to ensure that the panel 1 is not warped on account of the greater shrinkage in the region of the underside 9 of the panel 1 after the injection-molding operation. As a result, a panel 1 is provided which makes available for further processing virtually planar semiconductor component positions 18 arranged next to one another.

Figure 3:
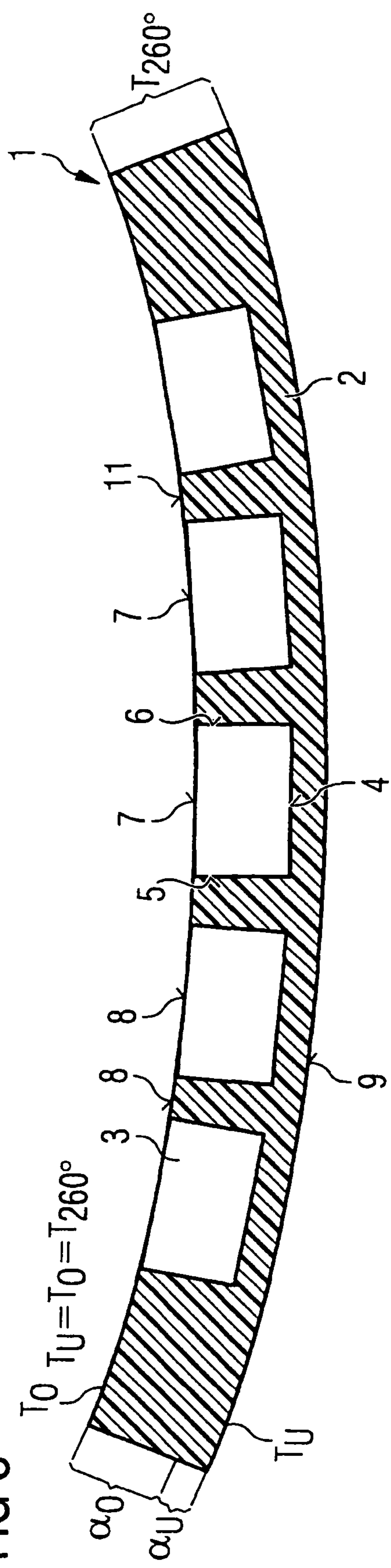
FIG. 3 shows a schematic cross-section through a panel that has not been subjected to heat treatment after introduction into a soldering furnace at a soldering temperature of $T_U = T_O = 260°$ C.

FIG. 3 shows a schematic cross-section through a panel 1 that has not been subjected to heat treatment, after introduction into a soldering furnace at a soldering temperature of $T_U = T_O = 260°$ C. The warping of the panel 1 that occurs and is illustrated here does not correspond to the actual curvature of such a panel at the soldering temperature, but rather has been represented in an intensified or exaggerated manner in order to illustrate the problem. On account of the larger coefficient of expansion $\alpha_U$ on the underside of the panel, the degree of curvature shown here arises, especially as the upper coefficient of thermal expansion in the region of the top side 11 of the panel 1 $\alpha_O$ is essentially determined by the semiconductor chips 3, the coefficient of thermal expansion of which is approximately a factor of 4 lower than the coefficient of thermal expansion of the surrounding plastic housing composition. The heat treatment step according to the invention is advantageous for combating such warping during the steps for further processing of the panel 1.

Figure 4:
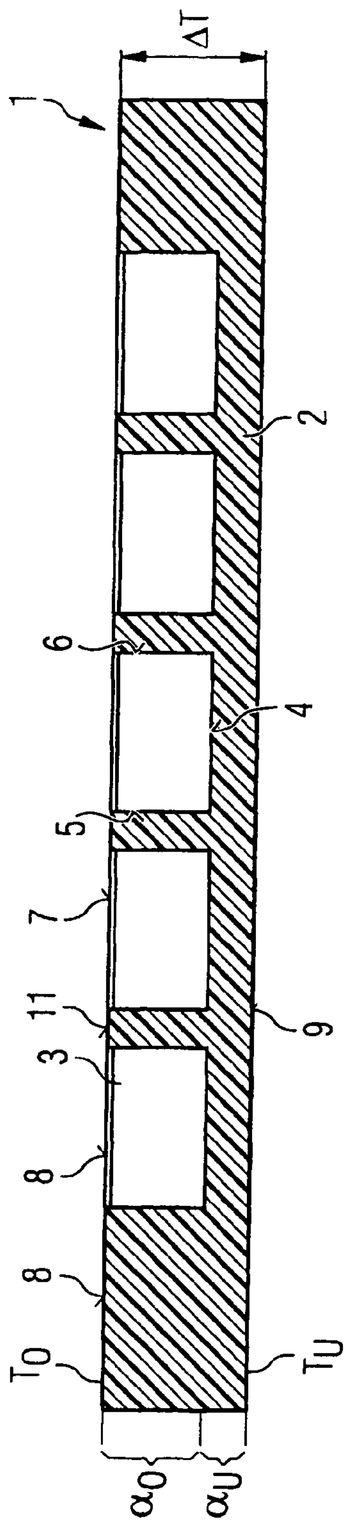
FIG. 4 shows a schematic cross-section through a heat-treated panel after heat treatment of the panel under a temperature gradient $\Delta T$ of 300° C. for 5 minutes in the apparatus shown in FIG. 1, where $T_U = T_R$ and $T_O = 300°$ C.$+T_R$.

FIG. 4 shows a schematic cross-section through a panel 1 after heat treatment of the panel 1 under a temperature gradient $\Delta T$ of 300° C. for 5 minutes where $T_U = T_R$ and $T_O = 300°$ C.$+T_R$ in the apparatus 14 shown in FIG. 1. This heat treatment results in relaxation processes of the plastic housing material 2 which provide for a dimensional stability of the panel 1 even though a coefficient of thermal expansion $\alpha_O$ in the upper region of the panel 1 is still significantly lower than the coefficient of thermal expansion $\alpha_U$ in the lower region of the panel 1.

Figure 5:
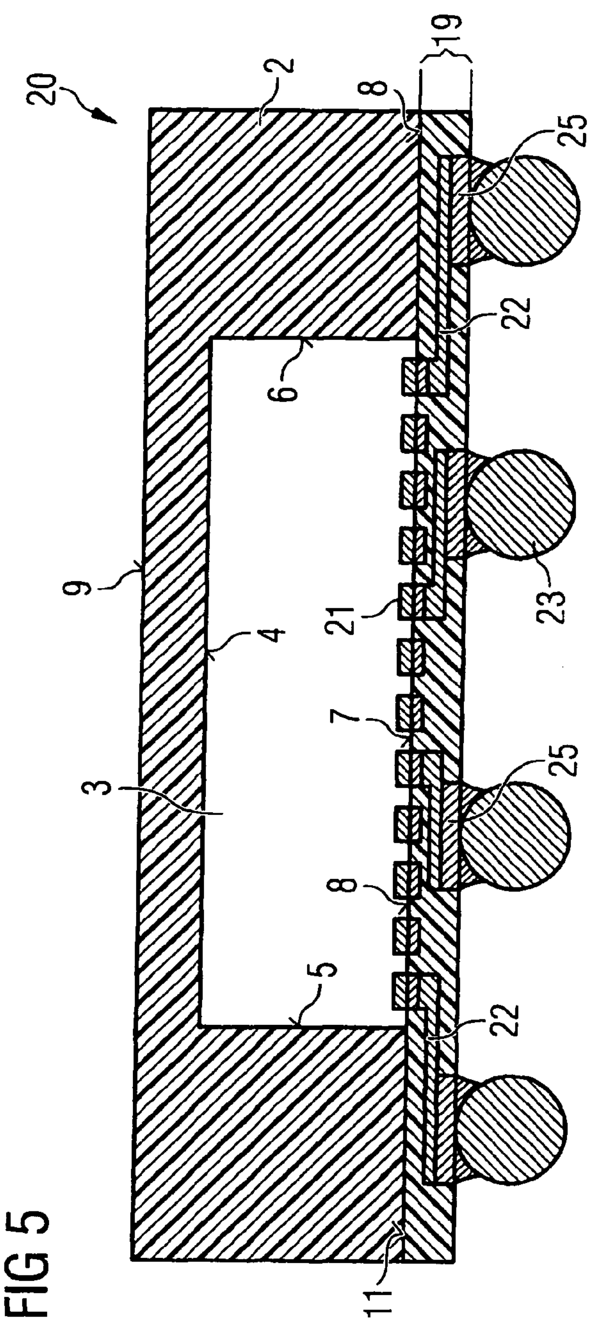
FIG. 5 shows a schematic cross-section through a semiconductor component from a semiconductor component position of a heat-treated panel in accordance with the present invention.

FIG. 5 shows a schematic cross-section through a semiconductor component 20 of a semiconductor component position 18 of a heat-treated panel 1 shown in FIG. 4. In order to produce a semiconductor component 20 of this type, a rewiring structure 19 is applied to the top side 11 of the heat-treated panel 1 illustrated in FIG. 4, which rewiring structure connects contact areas 21 on the active top side 7 of the semiconductor chip 3 to external contact areas 25 of the wiring structure 19 via conductor tracks 22. External contacts 23 can then be soldered on to the panel 1 on the external contact areas 25 before the panel 1 itself is actually separated into individual semiconductor components 20 such as one of the semiconductor components shown in FIG. 5.

As a result of the heat treatment of the panel 1 shown in FIG. 4, the warping per semiconductor component 20 becomes so small that the wiring structure 19 can be applied to the coplanar area 8 shown in FIG. 4 by selective photolithographically patterned insulation layers and photolithographically patterned metallization layers, without additional restrictions of the photolithographic patterning occurring.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for heat treating a panel, the method comprising:

providing a panel comprising a plastic housing composition, a plurality of semiconductor chips embedded in the plastic housing composition such that rear sides and edge sides of the semiconductor chips are disposed within the plastic housing composition and top sides of the semiconductor chips form a coplanar area with a top side of the plastic housing composition, wherein an underside of the panel is formed by the plastic housing composition;

fixing the underside of the panel to a holder;

generating a temperature gradient ($\Delta T$) between the top side of the panel including the coplanar area and the underside of the panel;

maintaining the temperature gradient ($\Delta T$) for at least a selected time period; and cooling the panel to room temperature ($T_R$);

wherein:

the generating of the temperature gradient ($\Delta T$) includes placing the panel between two holders providing different sources of heat such that one of the top side and the underside of the panel is heated while the other of the top side and the underside of the panel is simultaneously cooled; and the steps of generating and maintaining a temperature gradient ($\Delta T$) between the top side of the panel and the underside of the panel and cooling the panel to room temperature ($T_R$) prior or soldering or application of any structure to the underside of the panel.

2. The method of claim 1, wherein the fixing of the underside of the panel to the holder comprises mechanically fixing the underside of the panel to a planar holder.

3. The method of claim 1, wherein the fixing of the underside of the panel to the holder comprises pneumatically holding the panel to a planar vacuum holder.

4. The method of claim 1, wherein the fixing of the underside of the panel to the holder comprises pressing the panel onto a planar holder using press-on plates.

5. The method of claim 1, wherein the generation of a temperature gradient ($\Delta T$) between the top side of the panel including the coplanar area and the underside of the panel includes thermal irradiation of the top side of the panel.

6. The method of claim 1, wherein the generation of a temperature gradient ($\Delta T$) between the top side of the panel including the coplanar area and the underside of the panel includes heating the holder and cooling the top side of the panel.

7. The method of claim 6, wherein the top side of the panel is cooled utilizing a gas flow or a liquid flow.

8. The method of claim 1, wherein the generation of a temperature gradient ($\Delta T$) between the top side of the panel including the coplanar area and the underside of the panel includes cooling the holder and heating the top side of the panel utilizing a gas flow or a liquid flow.

9. The method of claim 1, wherein a selected amount of heat is provided to the panel such that a relaxation of material forming the panel is initiated.

10. The method of claim 1, wherein a selected amount of heat is provided to the panel such that thermal stresses are prevented during cooling of the panel.

11. The method of claim 1, wherein the temperature gradient ($\Delta T$) is varied dynamically during the heat treatment of the panel.

12. A method for heat treating a panel, the method comprising:

providing a panel comprising a plastic housing composition, a plurality of semiconductor chips embedded in the plastic housing composition such that rear sides and edge sides of the semiconductor chips are disposed within the plastic housing composition and top sides of the semiconductor chips form a coplanar area with a top side of the plastic housing composition, wherein an underside of the panel is formed by the plastic housing composition;

fixing the underside of the panel to a holder;

generating a temperature gradient ($\Delta T$) between the top side of the panel including the coplanar area and the underside of the panel;

maintaining the temperature gradient ($\Delta T$) for at least a selected time period; and cooling the panel to room temperature ($T_R$);

wherein the steps of generating and maintaining a temperature gradient ($\Delta T$) between the top side of the panel and the underside of the panel and cooling the panel to room temperature ($T_R$) are performed prior to any soldering or application of any structure to the underside of the panel.

* * * * *